(12) United States Patent
Roux

(10) Patent No.: US 11,677,431 B2
(45) Date of Patent: Jun. 13, 2023

(54) RADIO FREQUENCY ASSEMBLY WITH IMPROVED ISOLATION

(71) Applicant: STMicroelectronics SA, Montrouge (FR)

(72) Inventor: Jocelyn Roux, Hurteres (FR)

(73) Assignee: STMicroelectronics SA, Montrouge (FR)

( * ) Notice: Subject to any disclaimer, the term of this patent is extended or adjusted under 35 U.S.C. 154(b) by 329 days.

(21) Appl. No.: 16/951,726

(22) Filed: Nov. 18, 2020

(65) Prior Publication Data

US 2022/0158683 A1 May 19, 2022

(30) Foreign Application Priority Data

Nov. 13, 2020 (FR) ...................... 2011663

(51) Int. Cl.
*H03F 3/19* (2006.01)
*H04B 1/40* (2015.01)

(52) U.S. Cl.
CPC ............... *H04B 1/40* (2013.01); *H03F 3/19* (2013.01); *H03F 2200/451* (2013.01)

(58) Field of Classification Search
CPC .................................. H03F 3/19; H04B 1/40
See application file for complete search history.

(56) References Cited

U.S. PATENT DOCUMENTS 5,551,075 A 8/1996 Caux et al.
5,625,327 A * 4/1997 Carroll ................. H03B 5/1203
331/74
2012/0154054 A1* 6/2012 Kaczman .................. H03F 3/72
330/295
2012/0235737 A1* 9/2012 Reisner ................. H03F 1/0227
330/127
2016/0013758 A1* 1/2016 Cao ........................ H03F 1/3241
330/297
2018/0226367 A1* 8/2018 Babcock ................. H03F 1/565
2018/0358931 A1 12/2018 Takenaka

OTHER PUBLICATIONS

Durand. C., et al., "Innovative 8-shaped inductors integrated in an advanced BiCMOS technology", IEEE 11th Topical Meeting on Silicon Monolithic Integrated Circuits in RF Systems, Jan. 17-19, 2011, pp. 81-84.

* cited by examiner

*Primary Examiner* — Patricia T Nguyen
(74) *Attorney, Agent, or Firm* — Slater Matsil, LLP

(57) ABSTRACT

The invention relates to a radio frequency assembly comprising a radio frequency circuit comprising at least one group of N≥2 amplifiers (A1, A2) disposed in series on a substrate (1), said assembly comprising a package (2) wherein the substrate (1) is disposed, each amplifier comprising a local grounding point (b1, b2, b3) and a local feed point (a1, a2, a3), said common grounding points being connected to a common ground (GND) outside the package (2), said common feed points being connected to a common power supply (VDD) outside the package, said assembly comprising at least N−1 parallel LC circuits disposed between the common power supply (VDD) and the local feed point (a2, a3) of an amplifier (A2) so as to attenuate the current loops between two amplifiers in series.

22 Claims, 4 Drawing Sheets

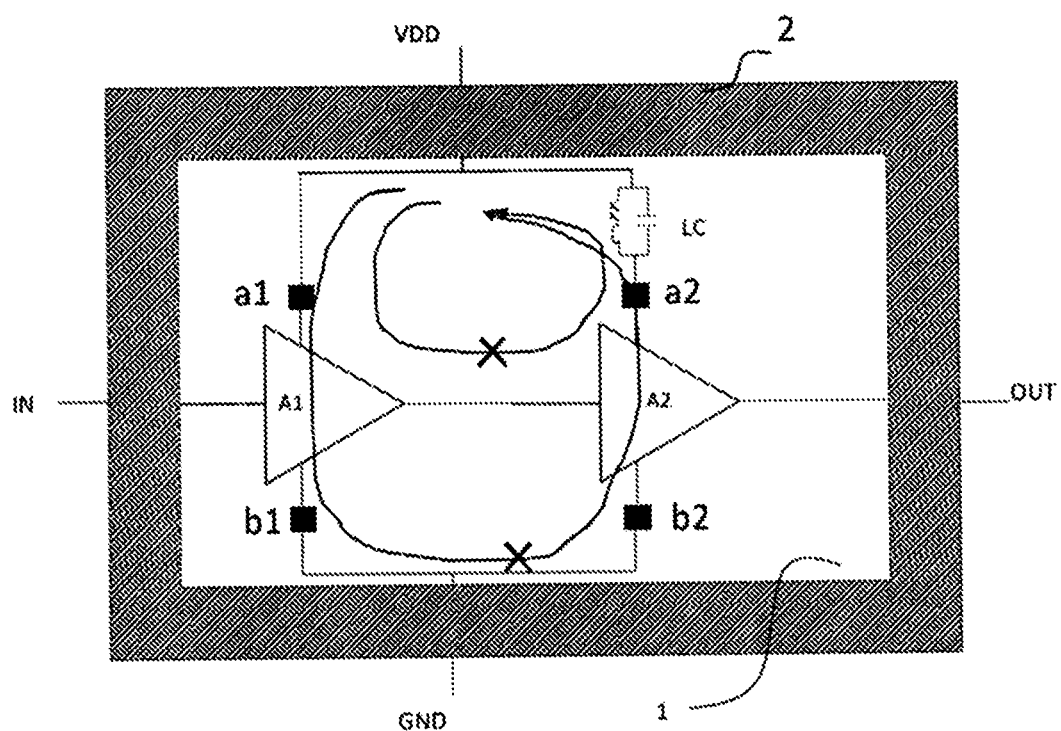
[Fig. 1]
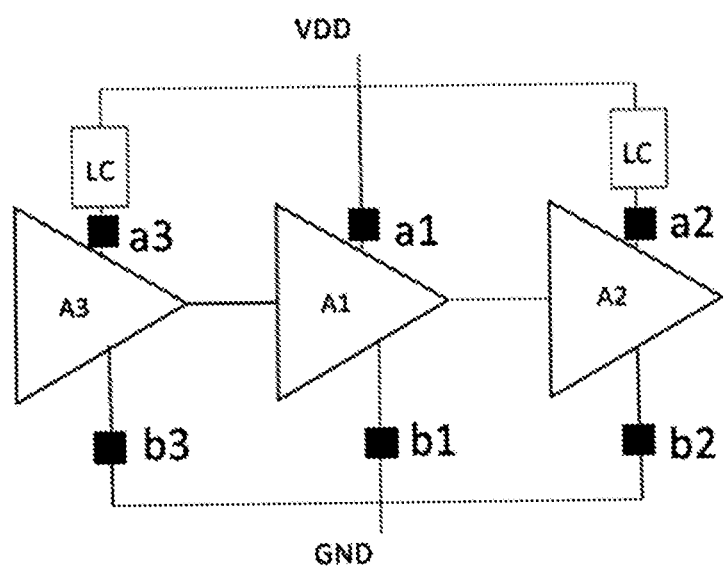
[Fig. 2]

[Fig. 3]
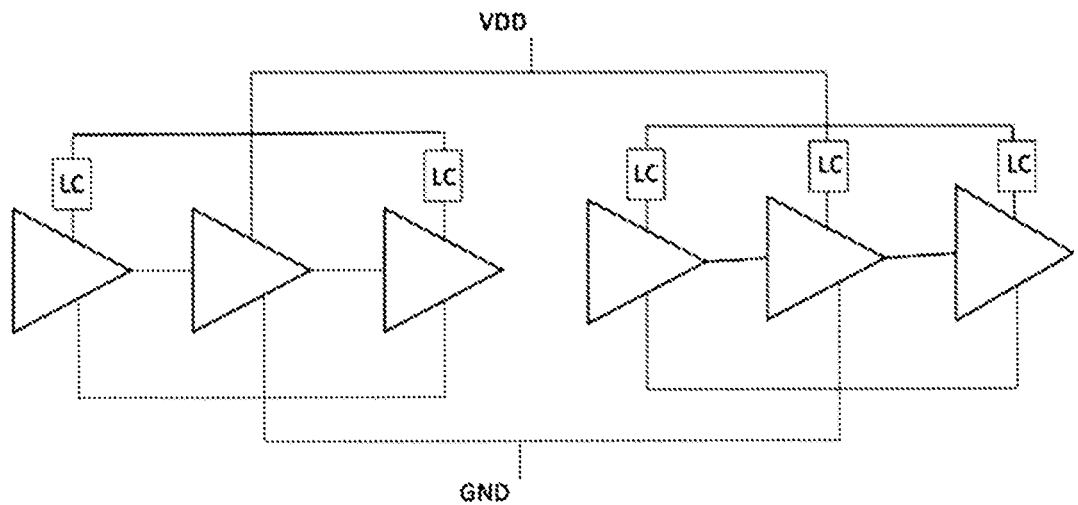
[Fig. 4]
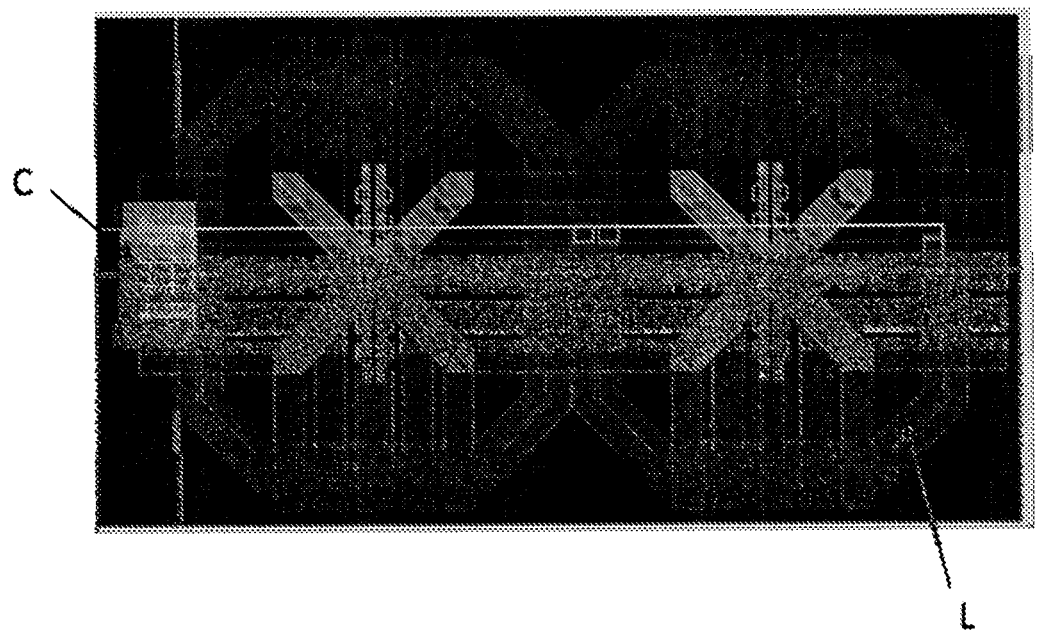

[Fig. 5]
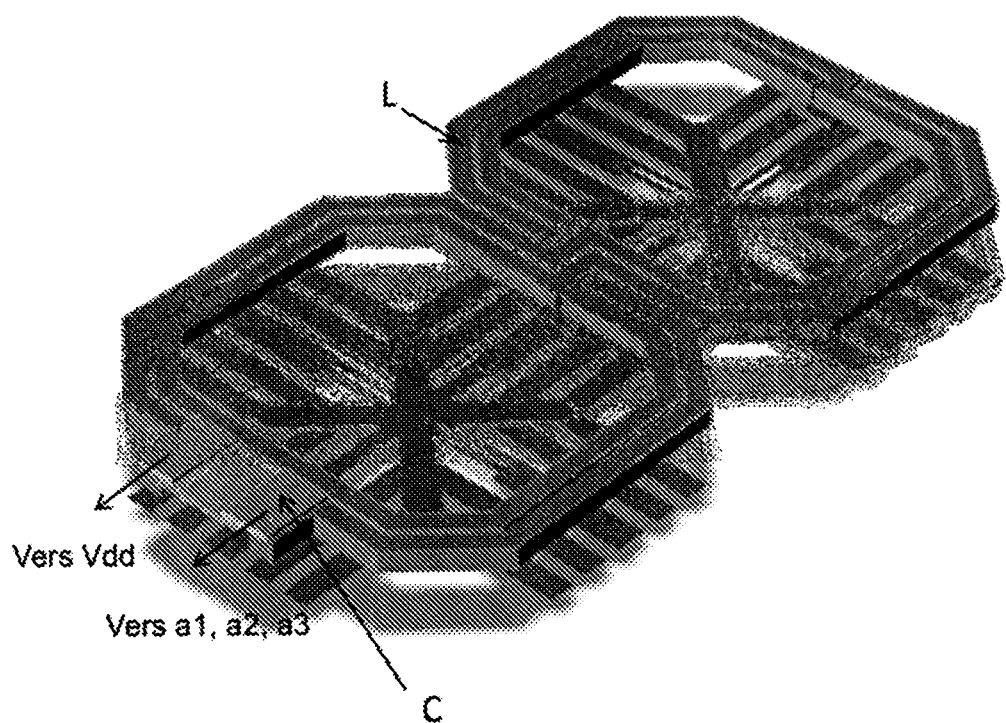
[Fig. 6]
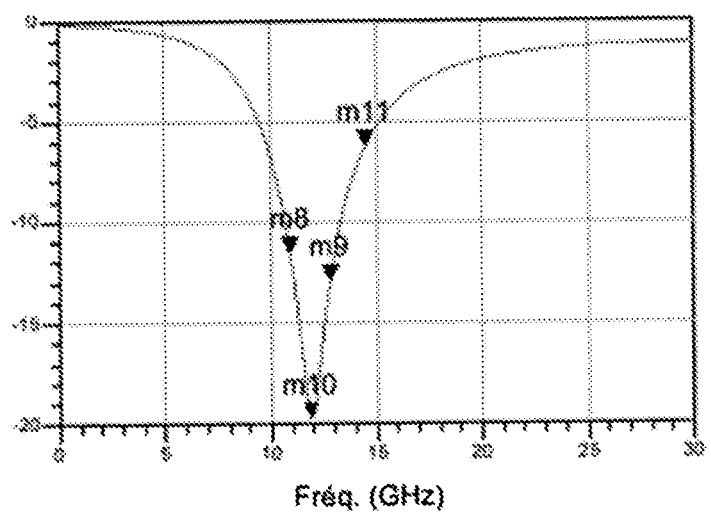
m8 = 10,90 GHz; S(1,2) = -11,485 dB
m9 = 12,80 GHz; S(1,2) = -12,888 dB
m10 = 11,85 GHz; S(1,2) = -19,629 dB
m11 = 14,50 GHz; S(1,2) = -6,171 dB

[Fig. 7]
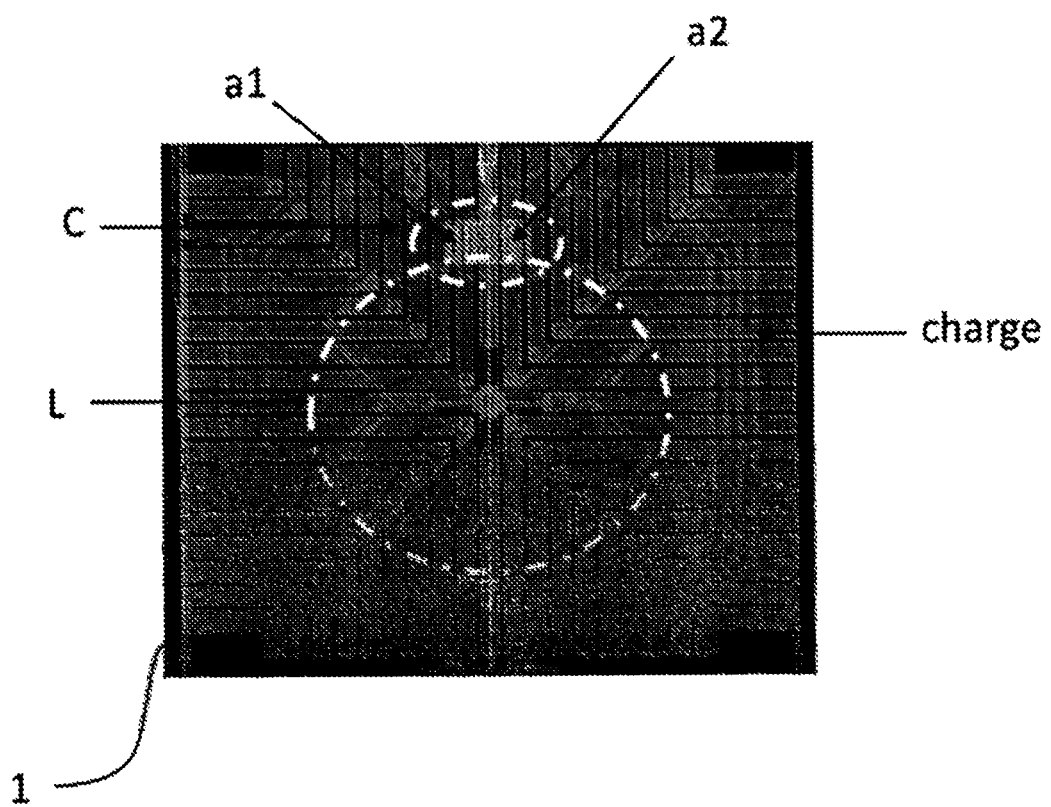

RADIO FREQUENCY ASSEMBLY WITH IMPROVED ISOLATION

CROSS-REFERENCE TO RELATED APPLICATIONS

This application claims priority to French Patent Application No. 2011663, filed on Nov. 13, 2020.

TECHNICAL FIELD

The invention relates to a radio frequency assembly.

BACKGROUND

A transmitter/receiver device conventionally comprises a transmitter and a receiver connected to the same antenna, in particular in the space, military and future 5G fields.

The receiver in particular comprises a radio frequency stage for amplifying and conditioning the signal received by the antenna and comprises a plurality of electronic components for this purpose. The radio frequency stage is conventionally connected to a digital processing stage, optionally via an analogue-to-digital converter. Elements performing the reverse functions are present in the receiver.

The radio frequency stage in particular comprises a plurality of amplifiers, each constituting an amplifier stage. These amplifiers are usually disposed on an integrated circuit disposed in a package. These amplifiers share the same power supply and the same ground. This common power supply and this common ground are conventionally disposed outside the package. Thus, the "path" to find these common elements leads to cross-couplings between the amplifiers which are detrimental to performance, all the more so the higher the operating frequency of these amplifiers. Thus, in the case of satellite communications, this frequency is high and it is thus understood that the coupling between amplifiers is high. In particular, these cross-couplings are formed by current loops between the grounds of two amplifiers, between the power supplies of two amplifiers and between the grounds and the power supplies of two amplifiers.

The gain of the amplifiers can be reduced in order to reduce these couplings. However, this solution is not feasible since it leads to performance losses. Another solution involves increasing the isolation of the package by creating power supplies and grounds specific to each amplifier. Again, this solution is not feasible since it increases the cost of the package and the size of the integrated circuit.

Yet another solution involves adding an RC circuit between the power supply to the amplifier and the common power supply in order to reduce the current loops between the common power supply and the power supply to the amplifier. However, this solution causes voltage drops between the common power supply and the power supply to the amplifier.

None of the known solutions thus allow for the decoupling of the amplifiers in a radio frequency stage without reducing the performance of the stage.

SUMMARY

Embodiment relate to the transmission and receipt of signals, for example satellite signals, by means of a transmitter/receiver device. Particular embodiments relate to the radio frequency stage of the receiver connected to the antenna.

The invention proposes a solution to overcome at least one of these drawbacks.

For this purpose, the invention proposes a radio frequency assembly comprising a radio frequency circuit comprising at least one group of N≥2 amplifiers disposed in series on a substrate, said assembly comprising a package wherein the substrate is disposed, each amplifier comprising a local grounding point and a local feed point, said common grounding points being connected to a common ground outside the package, said common feed points being connected to a common power supply outside the package, said assembly comprising at least N−1 parallel LC circuits disposed between the common power supply and the local feed point of an amplifier so as to attenuate the current loops between two amplifiers in series.

Advantageously, the invention is complemented by the following features, which can be implemented alone or in any combination technically possible:

- each amplifier of each group has the same operating frequency, the LC circuit having a resonant frequency equal to the operating frequency of the amplifier;
- each amplifier of each group has the same operating frequency band, the LC circuit having a resonant frequency equal to the center frequency of the operating frequency band of the amplifier;
- it comprises at least N−1 parallel LC circuits;
- each amplifier comprises an active part and a passive part disposed on the support, an LC circuit associated with an amplifier being disposed inside the passive part constituted by a load;
- the inductance of the LC circuit is constituted by an 8-shaped inductor;
- it comprises groups of amplifiers connected in parallel, the whole comprising N≥2 amplifiers.

The invention further relates to a transmitter/receiver device comprising a radio frequency assembly according to the invention.

The invention further relates to a transmitter/receiver device comprising a radio frequency assembly according to the invention.

The invention allows the performance of a radio frequency assembly to be improved at a low cost.

BRIEF DESCRIPTION OF THE DRAWINGS

Other features, purposes and advantages of the invention will be better understood upon reading the following description, which is provided for illustration purposes only and is not intended to limit the scope of the invention, and which must be read with reference to the accompanying drawings, in which:

FIG. 1 shows a radio frequency assembly according to the invention;

FIG. 2 shows a radio frequency assembly according to the invention;

FIG. 3 shows a radio frequency assembly according to the invention;

FIGS. 4 to 5 show one possible implementation of a compliant LC circuit used in the invention;

FIG. 6 shows one example of the performance that can be achieved with the invention;

FIG. 7 shows one possible implementation of a radio frequency assembly according to the invention.

Similar components bear identical reference numerals in all of the figures.

DETAILED DESCRIPTION OF ILLUSTRATIVE EMBODIMENTS

As shown in FIG. 1, a radio frequency assembly comprises at least one group of a plurality of amplifiers A1, A2 disposed in series on a substrate 1, the whole being disposed inside a package 2.

The assembly thus comprises at least one group of N≥2 amplifiers, which groups can be disposed in parallel with one another.

FIG. 1 shows a group of two amplifiers A1, A2. All amplifiers in the same group are considered to have the same operating frequency or operating frequency band.

In each group, each amplifier comprises a local grounding point b1, b2 inside the package 2 as well as a local feed point a1, a2, also inside the package 2. These local points are respectively connected to a common ground GND on the one hand, and to a common power supply VDD. The common ground GND and the common power supply VDD are disposed outside the package 2. It is from these local points that the amplifiers are either grounded or connected to the power supply.

As shown in FIG. 1, a parallel LC circuit is disposed between a local feed point a2 and the common feed point VDD which is also connected to the common feed point a1 of the other amplifier A1. This allows the current loops between two amplifiers A1, A2 in series or in parallel in the same package to be attenuated.

In particular, this LC circuit allows the current loop between the local feed points (top loop) and the current loop between the common ground GND and the common power supply VDD (large loop) to be attenuated.

Preferably, the LC circuit is inside the package 2.

Preferably, the LC circuit is dimensioned such that it has a resonant frequency that corresponds to the operating frequency or frequency band of the amplifier depending on the case. In this manner, the circuit will only allow signals with a frequency different from the operating frequency or frequency band to pass (for example the current from the VDD with a zero frequency will pass in order to power the amplifiers). Advantageously, the LC circuit will isolate the two amplifiers in the center of the operating frequency band in the case whereby the amplifier has an operating frequency band.

Additionally, as diagrammatically shown in FIG. 2 in the case of a group of three amplifiers A1, A2, A3, at least two LC circuits are present. All three amplifiers in the same group have the same operating frequency or frequency bands. Each amplifier A1, A2, A3 comprises a local feed point a1, a2, a3 and a local grounding point b1, b2, b3. The LC circuits are positioned on every second connection line between the local feed point a2, a3 and the common power supply VDD. By way of example, as shown in this figure, going from the last connection line between the local feed point and the common power supply VDD towards the first amplifier in the series, one LC circuit is disposed on every second connection line. It goes without saying that an LC circuit can be present on the last line, and an LC circuit can be present on the second line, with nothing on the first line.

FIG. 3 shows an assembly comprising two groups of three amplifiers. All of the amplifiers of each group have the same operating frequency. As shown in this figure, five LC circuits are present. One group comprises two LC circuits and the other group comprises three LC circuits.

In more general terms, the assembly comprises at least N−1 LC circuits, where N is the number of amplifiers. In such a case, the positioning of the LC circuits is arbitrary insofar as they are positioned between the common feed point and an amplifier. It goes without saying that the same number of circuits as there are amplifiers can be provided. This choice is dictated by compromising between overall dimensions and cost.

Several options are possible for implementing the solution presented hereinabove.

As shown in FIGS. 4 and 5, the LC circuit can take the form of an 8-shaped inductor connected to a capacitor C. The loop of the 8 starts at one armature of the capacitor and ends at the other armature of the capacitor C. The LC circuit is connected via the connection tabs, one in the direction of the common power supply Vdd, the other in the direction of a local feed point a1, a2, a3. FIG. 4 shows an overhead view of such a circuit and FIG. 5 shows a 3D view of the circuit in FIG. 4.

Such an LC circuit is typically sized so that it can be easily connected between two amplifiers to be isolated. For example, the circuit is 80 μm×80 μm in size.

FIG. 6 shows the performance of the isolation between two amplifiers of a radio frequency assembly comprising a group comprising two amplifiers and each having an operating frequency in a frequency band comprised between the point m8 at 10.90 GHz and m9 at 12.80 GHz. The isolation obtained between two amplifiers (between the common power supply and the power supply to an amplifier) is almost 20 dB in the mid-band (point m10) and at least 11 dB at the band edge (point m11).

Alternatively or additionally, as shown in FIG. 7, each amplifier comprises a passive part disposed on the substrate, an LC circuit associated with an amplifier being disposed inside the passive part, preferably constituted by a load. The capacitor C of the LC circuit is disposed above the inductor L of the LC circuit. Preferably, the inductor L of the LC circuit is constituted by an 8-shaped inductor.

As shown in this figure, the load takes the form of a spiral and the size thereof is dependent on the desired operation of the radio frequency assembly. Thus, this load offers unused space at the center thereof such that a plurality of components can be positioned therein.

The invention claimed is:

1. A radio frequency assembly comprising:
   a substrate;
   a first RF amplifier disposed on the substrate, the first amplifier having a first local grounding point and a first local feed point;
   a second RF amplifier disposed on the substrate and coupled in series with the first amplifier, the second amplifier having a second local grounding point and a second local feed point;
   a package, the substrate being disposed within the package, wherein the first and second local grounding points are configured to be connected to a common ground outside the package and the first and second local feed points are configured to be connected to a common power supply outside the package; and
   a parallel LC circuit disposed between the common power supply and the first local feed point of the first amplifier, wherein an inductance and a capacitance of the parallel LC circuit are selected so as to attenuate current loops between the first and second amplifiers in series.

2. The radio frequency assembly according to claim 1, wherein the first and second amplifiers are designed to operate at the same operating frequency, the LC circuit having a resonant frequency equal to the operating frequency of the first and second amplifiers.

3. The radio frequency assembly according to claim 1, wherein the first and second amplifiers are designed to operate in the same frequency band, the LC circuit having a resonant frequency equal to the center frequency of the operating frequency band of the first and second amplifiers.

4. The radio frequency assembly according to claim 1, wherein the first and second amplifiers each comprise an active part and a passive part disposed on the substrate, the LC circuit being disposed inside the passive part constituted by a load.

5. A radio frequency assembly comprising:
a substrate;
a first RF amplifier disposed on the substrate, the first amplifier having a first local grounding point and a first local feed point;
a second RF amplifier disposed on the substrate and coupled in series with the first amplifier, the second amplifier having a second local grounding point and a second local feed point;
a package, the substrate being disposed within the package, wherein the first and second local grounding points are configured to be connected to a common ground outside the package and the first and second local feed points are configured to be connected to a common power supply outside the package; and
a parallel LC circuit disposed between the common power supply and the first local feed point of the first amplifier, wherein the LC circuit has an inductance constituted by an 8-shaped inductor.

6. The radio frequency assembly according to claim 1, further comprising:
a third RF amplifier disposed on the substrate, the third amplifier having a third local grounding point and a third local feed point;
a fourth RF amplifier disposed on the substrate and coupled in series with the third amplifier, the fourth amplifier having a fourth local grounding point and a fourth local feed point, wherein the third and fourth local grounding points are configured to be connected to the common ground outside the package and the third and fourth local feed points are configured to be connected to the common power supply outside the package; and
a second parallel LC circuit disposed between the common power supply and the third local feed point of the third amplifier.

7. The radio frequency assembly according to claim 6, wherein the first and second amplifiers are coupled in parallel with the third and fourth amplifiers.

8. The radio frequency assembly according to claim 6, wherein the first and second amplifiers are designed to operate at the same operating frequency, the LC circuit having a resonant frequency equal to the operating frequency of the first and second amplifiers; and
wherein the third and fourth amplifiers are designed to operate at the same operating frequency, the second LC circuit having a resonant frequency equal to the operating frequency of the third and fourth amplifiers.

9. The radio frequency assembly according to claim 6, wherein the first and second amplifiers are designed to operate in the same operating frequency band, the LC circuit having a resonant frequency equal to the center frequency of the operating frequency band of the first and second amplifiers; and
wherein the third and fourth amplifiers are designed to operate in the same operating frequency band, the second LC circuit having a resonant frequency equal to the center frequency of the operating frequency band of the third and fourth amplifiers.

10. A radio frequency assembly comprising:
a substrate;
a radio frequency circuit comprising a plurality of groups of amplifiers disposed in series on the substrate, each group having at least N amplifiers where N is greater than or equal to 2, each amplifier comprising a local grounding point and a local feed point;
a package, the substrate being disposed within the package, wherein the local grounding points are connected to a common ground outside the package and the local feed points are connected to a common power supply outside the package; and
N−1 parallel LC circuits associated with one of the groups of amplifiers, the parallel LC circuits being disposed between the common power supply and the local feed point of an amplifier of the associated group of amplifiers.

11. The radio frequency assembly according to claim 10, wherein the radio frequency assembly comprises a plurality of groups parallel LC circuits, each group having at least N−1 parallel LC circuits and at least one of the groups having only N−1 parallel LC circuits.

12. The radio frequency assembly according to claim 11, wherein each amplifier of a respective group has the same operating frequency, the N−1 parallel LC circuits associated with the respective group having a resonant frequency equal to the operating frequency of the amplifiers of the respective group.

13. The radio frequency assembly according to claim 11, wherein each amplifier of each group has the same operating frequency band, the N−1 parallel LC circuits associated with the respective group having a resonant frequency equal to the center frequency of the operating frequency band of the amplifiers of the respective group.

14. The radio frequency assembly according to claim 10, wherein each amplifier comprises an active part and a passive part disposed on the substrate, an LC circuit associated with an amplifier being disposed inside the passive part constituted by a load.

15. The radio frequency assembly according to claim 10, wherein the LC circuit has an inductance constituted by an 8-shaped inductor.

16. The radio frequency assembly according to claim 10, wherein the groups of amplifiers are connected in parallel.

17. A radio frequency apparatus comprising:
an antenna;
a transmitter coupled to the antenna;
a receiver coupled to the antenna, the receiver comprising an RF circuit disposed within a package;
a common ground node outside the package of the receiver;
a common power supply node outside the package of the receiver;
wherein the receiver comprises:
a substrate disposed within the package of the receiver;
a first RF amplifier disposed on the substrate, the first amplifier having a first local grounding point coupled to the common ground node and a first local feed point coupled to the common power supply node;
a second RF amplifier disposed on the substrate and coupled in series with the first amplifier, the second amplifier having a second local grounding point coupled to the common ground node and a second local feed point coupled to the common power supply node; and a parallel LC circuit disposed between the common power supply node and the first local feed point of the first amplifier, wherein an inductance and a capacitance of the parallel LC circuit is selected so as to attenuate current loops between the first and second amplifiers in series.

18. The radio frequency apparatus according to claim 17, wherein the first and second amplifiers are designed to operate at the same operating frequency, the LC circuit having a resonant frequency equal to the operating frequency of the first and second amplifiers.

19. The radio frequency apparatus according to claim 17, wherein the first and second amplifiers are designed to operate in the same frequency band, the LC circuit having a resonant frequency equal to the center frequency of the operating frequency band of the first and second amplifiers.

20. The radio frequency apparatus according to claim 17, wherein the first and second amplifiers each comprise an active part and a passive part disposed on the substrate, the LC circuit being disposed inside the passive part constituted by a load.

21. The radio frequency apparatus according to claim 17, wherein the LC circuit has an inductance constituted by an 8-shaped inductor.

22. The radio frequency apparatus according to claim 17, wherein the receiver further comprises:

a third RF amplifier disposed on the substrate, the third amplifier having a third local grounding point and a third local feed point;

a fourth RF amplifier disposed on the substrate and coupled in series with the third amplifier, the fourth amplifier having a fourth local grounding point and a fourth local feed point, wherein the third and fourth local grounding points are configured to be connected to the common ground node outside the package and the third and fourth local feed points are configured to be connected to the common power supply node outside the package; and a second parallel LC circuit disposed between the common power supply node and the third local feed point of the third amplifier.

* * * * *

UNITED STATES PATENT AND TRADEMARK OFFICE
CERTIFICATE OF CORRECTION

PATENT NO. : 11,677,431 B2
APPLICATION NO. : 16/951726
DATED : June 13, 2023
INVENTOR(S) : Jocelyn Roux Page 1 of 1

It is certified that error appears in the above-identified patent and that said Letters Patent is hereby corrected as shown below:

On the Title Page

Item (54), in Column 1, in "Title", Lines 1-2, delete "RADIO FREQUENCY ASSEMBLY WITH IMPROVED ISOLATION" and insert -- RADIO FREQUENCY (RF) ASSEMBLY --, therefor.

In the Specification

In Column 1, Lines 1-2, delete "RADIO FREQUENCY ASSEMBLY WITH IMPROVED ISOLATION" and insert -- RADIO FREQUENCY (RF) ASSEMBLY --, therefor.

In the Claims

In Column 6, in Claim 10, Line 7, after "having" delete "at least".

Signed and Sealed this
Twenty-first Day of November, 2023

Katherine Kelly Vidal
*Director of the United States Patent and Trademark Office*